United States Patent
Ohiwa

(10) Patent No.: US 7,956,933 B2
(45) Date of Patent: Jun. 7, 2011

(54) TUNER CIRCUIT AND DIGITAL BROADCAST RECEIVER WITH LOW DISTORTION PERFORMANCE AND LOW POWER CONSUMPTION

(75) Inventor: Kohji Ohiwa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 1310 days.

(21) Appl. No.: 11/515,474

(22) Filed: Sep. 5, 2006

(65) Prior Publication Data

US 2007/0052867 A1    Mar. 8, 2007

(30) Foreign Application Priority Data

Sep. 6, 2005 (JP) ................... 2005-257876

(51) Int. Cl.
*H04N 5/50* (2006.01)
*H04N 5/44* (2006.01)
(52) U.S. Cl. ......... 348/725; 348/731; 348/729; 348/726
(58) Field of Classification Search .................. 348/725, 348/726, 729, 731, 21; 455/250.1, 234.1, 455/136, 138, 337; 375/345, 346
See application file for complete search history.

(56) References Cited

U.S. PATENT DOCUMENTS

| 5,203,019 A * | 4/1993 | Rinderle ................... 455/67.13 |
| 6,628,343 B1 * | 9/2003 | Yamaguchi et al. .......... 348/731 |
| 7,330,707 B2 * | 2/2008 | Okanobu ...................... 455/140 |

FOREIGN PATENT DOCUMENTS

| JP | 62-231525 A | 10/1987 |
| JP | 6-153100 A | 5/1994 |
| JP | 2001-36354 A | 2/2001 |

* cited by examiner

*Primary Examiner* — Jefferey Harold
*Assistant Examiner* — Jean W Désir
(74) *Attorney, Agent, or Firm* — Birch, Stewart, Kolasch & Birch, LLP

(57) ABSTRACT

In a tuner circuit, an automatic gain control circuit generates an RF-AGC voltage for automatically controlling a gain of an RF-AGC amplifier in accordance with a level of a signal output from an IF amplifier. An emitter follower circuit includes a transistor for current amplification, and varies a drive current of the transistor in accordance with the RF-AGC voltage. Thus, when an interference signal is at a high level, the drive current of the transistor becomes large. Therefore, distortion performance of the emitter follower circuit is improved. On the other hand, in a normal state where the interference signal is at a low level, the drive current of the transistor fails to become large. Therefore, low power consumption is achieved.

16 Claims, 8 Drawing Sheets

TUNER CIRCUIT AND DIGITAL BROADCAST RECEIVER WITH LOW DISTORTION PERFORMANCE AND LOW POWER CONSUMPTION

This nonprovisional application is based on Japanese Patent Application No. 2005-257876 filed with the Japan Patent Office on Sep. 6, 2005, the entire contents of which are hereby incorporated by reference.

BACKGROUND OF THE INVENTION

1. Field of the Invention

The present invention relates to a tuner circuit and a digital broadcast receiver. In particular, the present invention relates to a tuner circuit and a digital broadcast receiver each receiving a television signal of a digital broadcast.

2. Description of the Background Art

About 50 years have elapsed since an analog television broadcast started. At present, a digital terrestrial television broadcast and a digital cable television broadcast tend to be mainstream. A digital broadcast is superior to an analog broadcast in terms of image quality, the number of channels, and functions. Hence, there is an increasing demand for a digital broadcast receiver such as a TV receiver, a VTR (Video Tape Recorder) or a STB (Set Top Box) capable of receiving a digital broadcast.

FIG. 9 is a block diagram illustrating a schematic configuration of a conventional digital broadcast receiver 200. As illustrated in FIG. 9, a tuner circuit 101 includes a wide band amplifier 111, an RF (Radio Frequency) input filter 112, an RF-AGC (Automatic Gain Control) amplifier 113, an RF interstage filter 114, a PLL (Phase Locked Loop) circuit 115, a local oscillator 116, a mixing circuit 117, an IF (Intermediate Frequency) amplifier 118, an automatic gain control circuit 119, an emitter follower circuit 120, an If filter 121, an IF-AGC amplifier 122, an A/D (Analog/Digital) converter 123, a digital demodulation circuit 124, and an error correction circuit 125.

Wide band amplifier 111 receives a television signal (RF signal) received by an antenna 102, amplifies the signal over a wide frequency band, and outputs a resultant signal. RF input filter 112 receives the signal output from wide band amplifier 111, removes an unnecessary component from the received signal, and allows only a signal in a desired frequency band to pass therethrough. RF-AGC amplifier 113 has a variable gain, radio frequency amplifies the signal (RF signal) passing through RF input filter 112, and outputs a resultant signal. RF interstage filter 114 receives the signal output from RF-AGC amplifier 113, removes an unnecessary component from the signal, and allows only a signal in a desired frequency band to pass therethrough.

Each of PLL circuit 115 and local oscillator 116 generates a local oscillation signal at an oscillation frequency corresponding to a frequency of a desired channel. Mixing circuit 117 mixes the signal output from RF interstage filter 114 with the local oscillation signal output from local oscillator 116, and frequency converts a resultant signal to an IF signal. IF amplifier 118 amplifies the IF signal output from mixing circuit 117, and outputs a resultant signal. Automatic gain control circuit 119 automatically controls the gain of RF-AGC amplifier 113 in accordance with a level of the signal output from IF amplifier 118.

Emitter follower circuit 120 is an impedance conversion circuit having a high input impedance and a low output impedance, and current amplifies the signal output from IF amplifier 118. IF filter 121 is, for example, a SAW (Surface Acoustic Wave) filter, receives the signal output from IF amplifier 118 through emitter follower circuit 120, removes an unnecessary component from the signal, and allows only a signal in a desired frequency band to pass therethrough. IF-AGC amplifier 122 has a variable gain, amplifies the signal (IF signal) passing through IF filter 121, and outputs a resultant signal. Herein, emitter follower circuit 120 plays a role of suppressing generation of a distortion signal in tuner circuit 101. Therefore, emitter follower circuit 120 is inserted so as to prevent distortion performance of tuner circuit 101 from being degraded even when IF filter 121 provided at a post-stage has a low impedance.

A/D converter 123 converts the signal output from IF-AGC amplifier 122 from an analog form to a digital form. Digital demodulation circuit 124 receives the digital signal output from A/D converter 123, and performs digital demodulation such as QAM demodulation or OFDM demodulation on the digital signal. Further, digital demodulation circuit 124 automatically controls the gain of IF-AGC amplifier 122 in accordance with a level of the signal output from A/D converter 123.

Error correction circuit 125 receives the signal subjected to digital demodulation by digital demodulation circuit 124, corrects an error generated due to an influence of noise and the like, and generates a TS (Transport Stream) signal. A/D converter 123, digital demodulation circuit 124 and error correction circuit 125 form a demodulation IC (Integrated Circuit) 126 integrated into one chip. The TS signal output from error correction circuit 125 is converted to a video signal, an audio signal and a data signal by a signal processing circuit 103 in digital broadcast receiver 200; thus, these signals can be displayed on a monitor 104 in an audio-visual manner.

FIG. 10 is a circuit diagram illustrating a configuration of emitter follower circuit 120 illustrated in FIG. 9. As illustrated in FIG. 10, emitter follower circuit 120 includes a transistor 131 for current amplification (e.g., bipolar transistor), and resistor elements 132, 133 and 134. Transistor 131 has a base B connected to an output node of IF amplifier 118 illustrated in FIG. 9, a collector C connected to a line of a power supply potential Vcc, and an emitter E connected to an input node of IF filter 121 illustrated in FIG. 9. Resistor element 132 is connected between collector C and base B in transistor 131. Resistor element 133 is connected between base B of transistor 131 and a line of a ground potential GND. Resistor element 134 is connected between emitter E of transistor 131 and a line of a ground potential GND.

In emitter follower circuit 120, each of resistor elements 132 and 133 on an input side has a large resistance value, and resistor element 134 on an output side has a small resistance value. Hence, emitter follower circuit 120 acts as an impedance conversion circuit having a high input impedance and a low output impedance. Resistor element 134 on the output side has a small resistance value; therefore, emitter follower circuit 120 can feed a relatively large current to a load connected to an output node and can withstand a load with a small resistance value.

With reference to FIG. 9 again, next, description will be given of an automatic gain control operation of each of RF-AGC amplifier 113 and IF-AGC amplifier 122. As illustrated in FIG. 9, in general, a digital broadcast receiver performs automatic gain control for an RF signal system and, also, performs automatic gain control for an IF signal system.

Automatic gain control circuit 119 detects a level of the signal output from IF amplifier 118, and generates an RF-AGC voltage for automatically controlling the gain of RF-AGC amplifier 113 such that the signal output from RF-AGC amplifier 113 is kept at a certain level, in accordance with the detected signal level. Specifically, if the signal output from IF amplifier 118 has a low level, automatic gain control circuit 119 increases the gain of RF-AGC amplifier 113 to thereby prevent degradation of a noise factor (NF). On the other hand, if the signal output from IF amplifier 118 has a high level, automatic gain control circuit 119 decreases the gain of RF-AGC amplifier 113 to thereby prevent degradation of distortion performance of tuner circuit 101. As described above, automatic gain control for an RF signal system is performed by detection of the level of the signal output from IF amplifier 118 in many cases.

Digital demodulation circuit 124 generates an IF-AGC voltage for automatically controlling the gain of IF-AGC amplifier 122 such that the signal output from IF-AGC amplifier 122 is kept at a certain level, in accordance with a level of the signal output from A/D converter 123. Specifically, if the signal output from A/D converter 123 has a low level, digital demodulation circuit 124 increases the gain of IF-AGC amplifier 122 to thereby optimize demodulation performance of demodulation IC 126. On the other hand, if the signal output from A/D converter 123 has a high level, digital demodulation circuit 124 decreases the gain of IF-AGC amplifier 122 to thereby optimize the demodulation performance of demodulation IC 126. As described above, digital demodulation circuit 124 has a function of performing automatic gain control for an IF signal system in many cases.

Herein, wide band amplifier 111 is provided for improving reception sensitivity of tuner circuit 101 over a wide frequency band. However, if the reception sensitivity is improved, but the signal received by antenna 102 has a strong input level (not less than 90 dBuV), emitter follower circuit 120 generates a distortion signal in some cases.

FIG. 11 shows distortion performance of emitter follower circuit 120. With reference to FIG. 11, if antenna 102 receives no interference signal, emitter follower circuit 120 generates no distortion signal. In a frequent case, even when a received interference signal has a level almost equal to that of a television signal, a distortion signal generated by emitter follower circuit 120 causes no problem.

However, in some cases, for example, an antenna station transmitting a television signal is located at a faraway place and an antenna station transmitting an interference signal is located nearby and, alternatively, a television signal has a considerably low level because radio waves are cut off by buildings and the like. Under the aforementioned peculiar conditions, as shown in FIG. 11, there is a possibility that a level of an interference signal is higher than that of a television signal by not less than 40 dB. In such a case, emitter follower circuit 120 generates a distortion signal, so that an influence of spurious interference is not negligible.

In view of this problem, there is demanded realization of a high-performance digital broadcast receiver capable of favorably receiving a desired television signal without an influence of an interference signal even under the aforementioned peculiar conditions.

Japanese Patent Laying-Open No. 06-153100 discloses a method of preventing saturation of radio frequency amplification when a reception electric field between adjoining channels is large and preventing interference between the adjoining channels based on this saturation, in a TV tuner device.

As described above, there is demanded realization of a high-performance digital broadcast receiver capable of favorably receiving a desired television signal without an influence of an interference signal even when a level of an interference signal is higher than that of a television signal by not less than 40 dB.

In order to improve the distortion performance of emitter follower circuit 120, it is effective that a drive current of transistor 131 included in emitter follower circuit 120 is made large. However, a demand for power saving is increased in recent years. Therefore, even when the drive current of emitter follower circuit 120 is simply made large, power consumption is undesirably increased. In addition, heat generation due to a large drive current causes a problem. As for mobile application, a battery has a limited lifetime; therefore, a large drive current is undesirable.

SUMMARY OF THE INVENTION

An object of the present invention is to provide a tuner circuit and a digital broadcast receiver with good distortion performance and low power consumption.

According to one aspect of the present invention, a tuner circuit receiving a television signal of a digital broadcast includes: a radio frequency amplifier having a variable gain, radio frequency amplifying the received television signal, and outputting a resultant signal; an oscillator generating a local oscillation signal at an oscillation frequency corresponding to a frequency of a desired channel; a mixing circuit mixing the signal output from the radio frequency amplifier with the local oscillation signal, frequency converting a resultant signal to a signal at an intermediate frequency, and outputting a resultant signal; an emitter follower circuit including a transistor for current amplification, having a high input impedance and a low output impedance, and current amplifying the signal output from the mixing circuit; a gain control circuit outputting a control voltage for automatically controlling the gain of the radio frequency amplifier such that the signal output from the radio frequency amplifier is kept at a certain level, in accordance with a level of the signal output from the mixing circuit; and a demodulation circuit receiving the signal output from the mixing circuit through the emitter follower circuit, digital demodulating the received signal, and generating a transport stream signal. Herein, the emitter follower circuit varies a drive current of the transistor for current amplification such that a distortion level becomes small, in accordance with the control voltage output from the gain control circuit.

Preferably, the emitter follower circuit varies a bias voltage of the transistor for current amplification to thereby vary the drive current of the transistor for current amplification, in accordance with the control voltage output from the gain control circuit.

Preferably, the emitter follower circuit varies a bias current of the transistor for current amplification to thereby vary the drive current of the transistor for current amplification, in accordance with the control voltage output from the gain control circuit.

Preferably, the tuner circuit further includes an inversion circuit provided between the gain control circuit and the emitter follower circuit, the inversion circuit inverting the control voltage output from the gain control circuit, and outputting a resultant voltage.

Preferably, the tuner circuit further includes a comparison circuit provided between the gain control circuit and the emitter follower circuit, the comparison circuit comparing the control voltage output from the gain control circuit with a predetermined reference voltage, and outputting a voltage in accordance with a result of the comparison.

Preferably, the mixing circuit includes a transistor for frequency conversion. The mixing circuit varies a drive current of the transistor for frequency conversion such that a distortion level becomes small, in accordance with the control voltage output from the gain control circuit.

Preferably, the tuner circuit further includes a wide band amplifier provided at a prestage of the radio frequency amplifier, the wide band amplifier including a transistor for amplification, amplifying a received television signal over a wide frequency band, and outputting a resultant signal. The wide band amplifier varies a drive current of the transistor for amplification such that a distortion level becomes small, in accordance with the control voltage output from the gain control circuit.

According to another aspect of the present invention, a digital broadcast receiver includes: a tuner circuit receiving a television signal of a digital broadcast; and a signal processing circuit converting a signal output from the tuner circuit to an audio-visual signal. Herein, the tuner circuit includes: a radio frequency amplifier having a variable gain, radio frequency amplifying the received television signal, and outputting a resultant signal; an oscillator generating a local oscillation signal at an oscillation frequency corresponding to a frequency of a desired channel; a mixing circuit mixing the signal output from the radio frequency amplifier with the local oscillation signal, frequency converting a resultant signal to a signal at an intermediate frequency, and outputting a resultant signal; an emitter follower circuit including a transistor for current amplification, having a high input impedance and a low output impedance, and current amplifying the signal output from the mixing circuit; a gain control circuit outputting a control voltage for automatically controlling the gain of the radio frequency amplifier such that the signal output from the radio frequency amplifier is kept at a certain level, in accordance with a level of the signal output from the mixing circuit; and a demodulation circuit receiving the signal output from the mixing circuit through the emitter follower circuit, digital demodulating the received signal, and generating a transport stream signal. The emitter follower circuit varies a drive current of the transistor for current amplification such that a distortion level becomes small, in accordance with the control voltage output from the gain control circuit.

Preferably, the emitter follower circuit varies a bias voltage of the transistor for current amplification to thereby vary the drive current of the transistor for current amplification, in accordance with the control voltage output from the gain control circuit.

Preferably, the emitter follower circuit varies a bias current of the transistor for current amplification to thereby vary the drive current of the transistor for current amplification, in accordance with the control voltage output from the gain control circuit.

Preferably, the tuner circuit further includes an inversion circuit provided between the gain control circuit and the emitter follower circuit, the inversion circuit inverting the control voltage output from the gain control circuit, and outputting a resultant voltage.

Preferably, the tuner circuit further includes a comparison circuit provided between the gain control circuit and the emitter follower circuit, the comparison circuit comparing the control voltage output from the gain control circuit with a predetermined reference voltage, and outputting a voltage in accordance with a result of the comparison.

Preferably, the mixing circuit includes a transistor for frequency conversion, and varies a drive current of the transistor for frequency conversion such that a distortion level becomes small, in accordance with the control voltage output from the gain control circuit.

Preferably, the tuner circuit further includes a wide band amplifier provided at a prestage of the radio frequency amplifier, the wide band amplifier including a transistor for amplification, amplifying a received television signal over a wide frequency band, and outputting a resultant signal. Herein, the wide band amplifier varies a drive current of the transistor for amplification such that a distortion level becomes small, in accordance with the control voltage output from the gain control circuit.

According to the present invention, it is possible to realize a tuner circuit and a digital broadcast receiver with good distortion performance and low power consumption.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
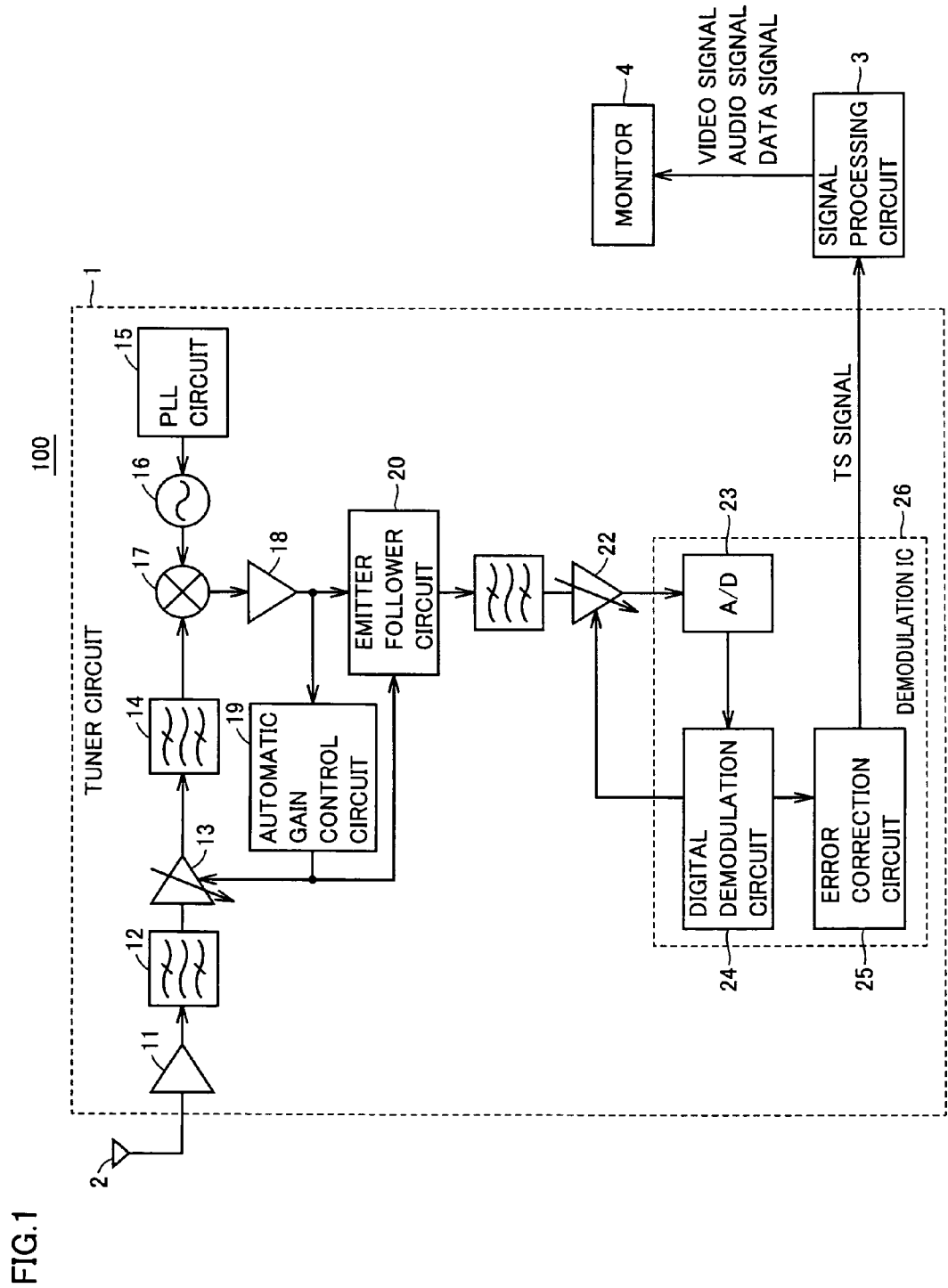
FIG. 1 is a block diagram illustrating a schematic configuration of a digital broadcast receiver according to a first embodiment of the present invention.

FIG. 1 is a block diagram illustrating a schematic configuration of a digital broadcast receiver 100 according to a first embodiment of the present invention. As illustrated in FIG. 1, digital broadcast receiver 100 includes a tuner circuit 1 and a signal processing circuit 3. Tuner circuit 1 includes a wide band amplifier 11, an RF input filter 12, an RF-AGC amplifier 13, an RF interstage filter 14, a PLL circuit 15, a local oscillator 16, a mixing circuit 17, an IF amplifier 18, an automatic gain control circuit 19, an emitter follower circuit 20, an IF filter 21, an IF-AGC amplifier 22, an A/D converter 23, a digital demodulation circuit 24, and an error correction circuit 25.

Wide band amplifier 11 receives a television signal (RF signal) received by an antenna 2, amplifies the signal over a wide frequency band, and outputs a resultant signal. RF input filter 12 receives the signal output from wide band amplifier 11, removes an unnecessary component from the received signal, and allows only a signal in a desired frequency band to pass therethrough. RF-AGC amplifier 13 has a variable gain, radio frequency amplifies the signal (RF signal) passing through RF input filter 12, and outputs a resultant signal. RF interstage filter 14 receives the signal output from RF-AGC amplifier 13, removes an unnecessary component from the signal, and allows only a signal in a desired frequency band to pass therethrough.

Each of PLL circuit 15 and local oscillator 16 generates a local oscillation signal at an oscillation frequency corresponding to a frequency of a desired channel. Mixing circuit 17 mixes the signal output from RF interstage filter 14 with the local oscillation signal output from local oscillator 16, and frequency converts a resultant signal to an IF signal. IF amplifier 18 amplifies the IF signal output from mixing circuit 17, and outputs a resultant signal. Automatic gain control circuit 19 detects a level of the signal output from IF amplifier 18, and generates an RF-AGC voltage for automatically controlling the gain of RF-AGC amplifier 13 such that the signal output from RF-AGC amplifier 13 is kept at a certain level, in accordance with the detected signal level.

Emitter follower circuit 20 is a circuit for current amplification having a high input impedance and a low output impedance. IF filter 21 is, for example, a SAW filter, receives the signal output from IF amplifier 18 through emitter follower circuit 20, removes an unnecessary component from the signal, and allows only a signal in a desired frequency band to pass therethrough. IF-AGC amplifier 22 has a variable gain, amplifies the signal (IF signal) passing through IF filter 21, and outputs a resultant signal. Herein, emitter follower circuit 20 plays a role of suppressing generation of a distortion signal in tuner circuit 1. Therefore, emitter follower circuit 20 is inserted so as prevent distortion performance of tuner circuit 1 from being degraded even when IF filter 21 provided at a poststage has a low impedance.

A/D converter 23 converts the signal output from IF-AGC amplifier 22 from an analog form to a digital form. Digital demodulation circuit 24 receives the digital signal output from A/D converter 23, and performs digital demodulation such as QAM demodulation or OFDM demodulation on the digital signal. Further, digital demodulation circuit 24 generates an IF-AGC voltage for automatically controlling the gain of IF-AGC amplifier 22 such that the signal output from IF-AGC amplifier 22 is kept at a certain level, in accordance with a level of the signal output from A/D converter 23.

Error correction circuit 25 receives the signal subjected to digital demodulation by digital demodulation circuit 24, corrects an error generated due to an influence of noise and the like, and generates a TS signal. A/D converter 23, digital demodulation circuit 24 and error correction circuit 25 form a demodulation IC 26 integrated into one chip. The TS signal output from error correction circuit 25 is converted to a video signal, an audio signal and a data signal by signal processing circuit 3 in digital broadcast receiver 100; thus, these signals can be displayed on a monitor 4 in an audio-visual manner.

Figure 2:
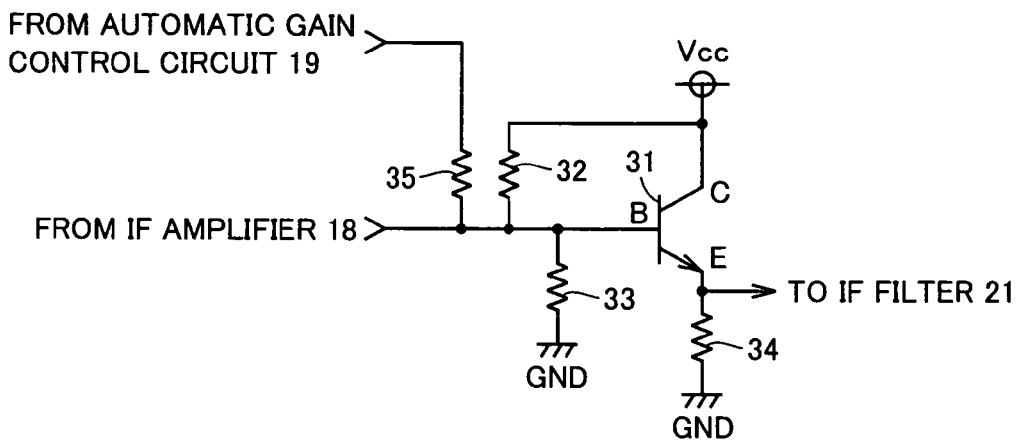
FIG. 2 is a circuit diagram illustrating a configuration of an emitter follower circuit illustrated in FIG. 1.

FIG. 2 is a circuit diagram illustrating a configuration of emitter follower circuit 20 illustrated in FIG. 1. As illustrated in FIG. 2, emitter follower circuit 20 includes a transistor 31 for current amplification (e.g., bipolar transistor), and resistor elements 32, 33, 34 and 35. Transistor 31 has a base B connected to an output node of IF amplifier 18 illustrated in FIG. 1, a collector C connected to a line of a power supply potential Vcc, and an emitter E connected to an input node of IF filter 21 illustrated in FIG. 1. Resistor element 32 is connected between collector C and base B in transistor 31. Resistor element 33 is connected between base B of transistor 31 and a line of a ground potential GND. Resistor element 34 is connected between emitter E of transistor 31 and a line of a ground potential GND.

In emitter follower circuit 20, each of resistor elements 32 and 33 on an input side has a large resistance value, and resistor element 34 on an output side has a small resistance value. Hence, emitter follower circuit 20 acts as an impedance conversion circuit having a high input impedance and a low output impedance. Resistor element 34 on the output side has a small resistance value; therefore, emitter follower circuit 20 can feed a relatively large current to a load on the output side and can withstand a load with a small resistance value.

Resistor element 35 is connected between an output node of automatic gain control circuit 19 illustrated in FIG. 1 and base B of transistor 31. That is, the RF-AGC voltage output from automatic gain control circuit 19 is supplied to base B of transistor 31 through resistor element 35. Consequently, when the RF-AGC voltage becomes high, a base voltage of transistor 31 is boosted. In other words, a bias voltage of transistor 31 becomes high. On the other hand, when the RF-AGC voltage becomes low, the base voltage of transistor 31 is reduced. In other words, the bias voltage of transistor 31 becomes low.

This circuit configuration is applied to a case of using automatic gain control circuit 19 of a forward type that boosts an RF-AGC voltage as a reception signal is at a high level. Specifically, when an interference signal is at a high level, a level of a reception signal becomes high; therefore, an RF-AGC voltage is boosted. Accordingly, when the base voltage of transistor 31 is boosted, a drive current of transistor 31 becomes large; thus, distortion performance of emitter follower circuit 20 is improved. As a result, emitter follower circuit 20 has a small distortion level and, therefore, can avoid an influence of spurious interference.

On the other hand, in a normal state where an interference signal is at a low level, a level of a reception signal fails to become high; therefore, an RF-AGC voltage is kept at a low level. Accordingly, the base voltage of transistor 31 is also kept at a low level. In addition, the drive current of transistor 31 is small; therefore, low power consumption is achieved.

As described above, in the first embodiment, it is possible to vary a drive current of transistor 31 in accordance with an RF-AGC voltage. Accordingly, it is possible to realize a tuner circuit and a digital broadcast receiver with good distortion performance and low power consumption. Moreover, each of the tuner circuit and the digital broadcast receiver can be realized by a simple configuration; therefore, increase in circuit parts and increase in cost can be suppressed as much as possible.

Figure 3:
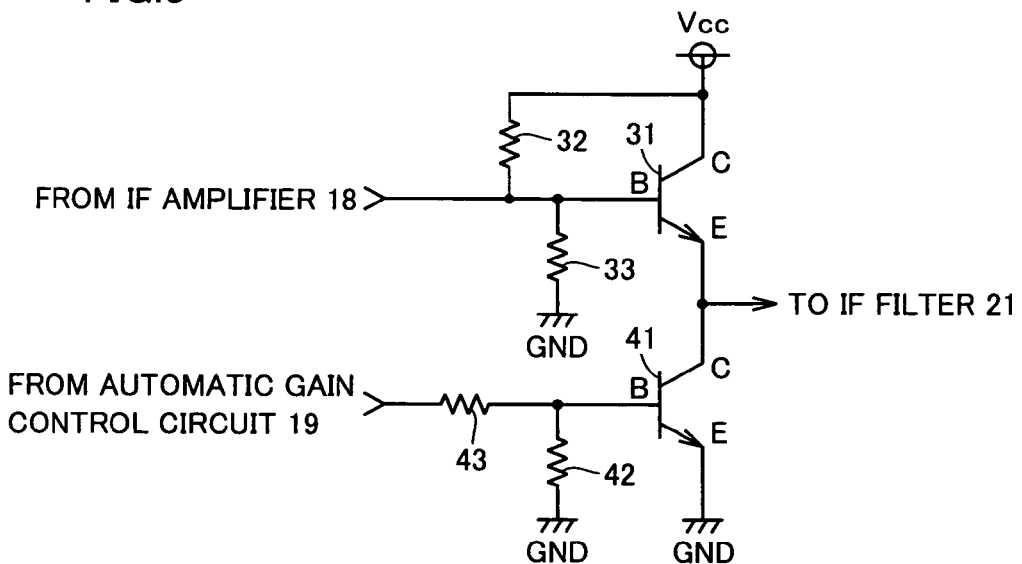
FIG. 3 illustrates a modification of the first embodiment.

FIG. 3 illustrates a modification of the first embodiment, and correlates with FIG. 2. An emitter follower circuit illustrated in FIG. 3 is different from the emitter follower circuit illustrated in FIG. 2 in the following point: resistor elements 34 and 35 are removed and, instead, a transistor 41 (e.g., bipolar transistor) and resistor elements 42 and 43 are newly provided. It is to be noted that parts in FIG. 3 corresponding to those in FIG. 2 are denoted by the identical symbols in FIG. 2; therefore, detailed description thereof will not be given here.

With reference to FIG. 3, transistor 41 is connected between emitter E of transistor 31 and the line of ground potential GND. Transistor 41 functions as a current source of transistor 31 for current amplification. Resistor element 42 is connected between a base B of transistor 41 and a line of a ground potential GND. Resistor element 43 is connected between the output node of automatic gain control circuit 19 illustrated in FIG. 1 and base B of transistor 41. That is, the RF-AGC voltage output from automatic gain control circuit 19 is supplied to base B of transistor 41 through resistor element 43. Consequently, when the RF-AGC voltage becomes high, a base voltage of transistor 41 is boosted and a bias current of transistor 31 becomes large. On the other hand, when the RF-AGC voltage becomes low, the base voltage of transistor 41 is reduced and the bias current of transistor 31 becomes small.

Specifically, when an interference signal is at a high level, a level of a reception signal becomes high; therefore, an RF-AGC voltage is boosted. Accordingly, when the base voltage of transistor 41 is boosted and the bias current of transistor 31 becomes large, the drive current of transistor 31 becomes large; thus, the distortion performance of emitter follower circuit 20 is improved. As a result, emitter follower circuit 20 has a small distortion level and, therefore, can avoid an influence of spurious interference.

On the other hand, in a normal state where an interference signal is at a low level, a level of a reception signal fails to become high; therefore, an RF-AGC voltage is kept at a low level. Accordingly, the base voltage of transistor 41 is also kept at a low level and the bias current of transistor 31 fails to become large. In addition, the drive current of transistor 31 is small; therefore, low power consumption is achieved.

Second Embodiment

Figure 4:
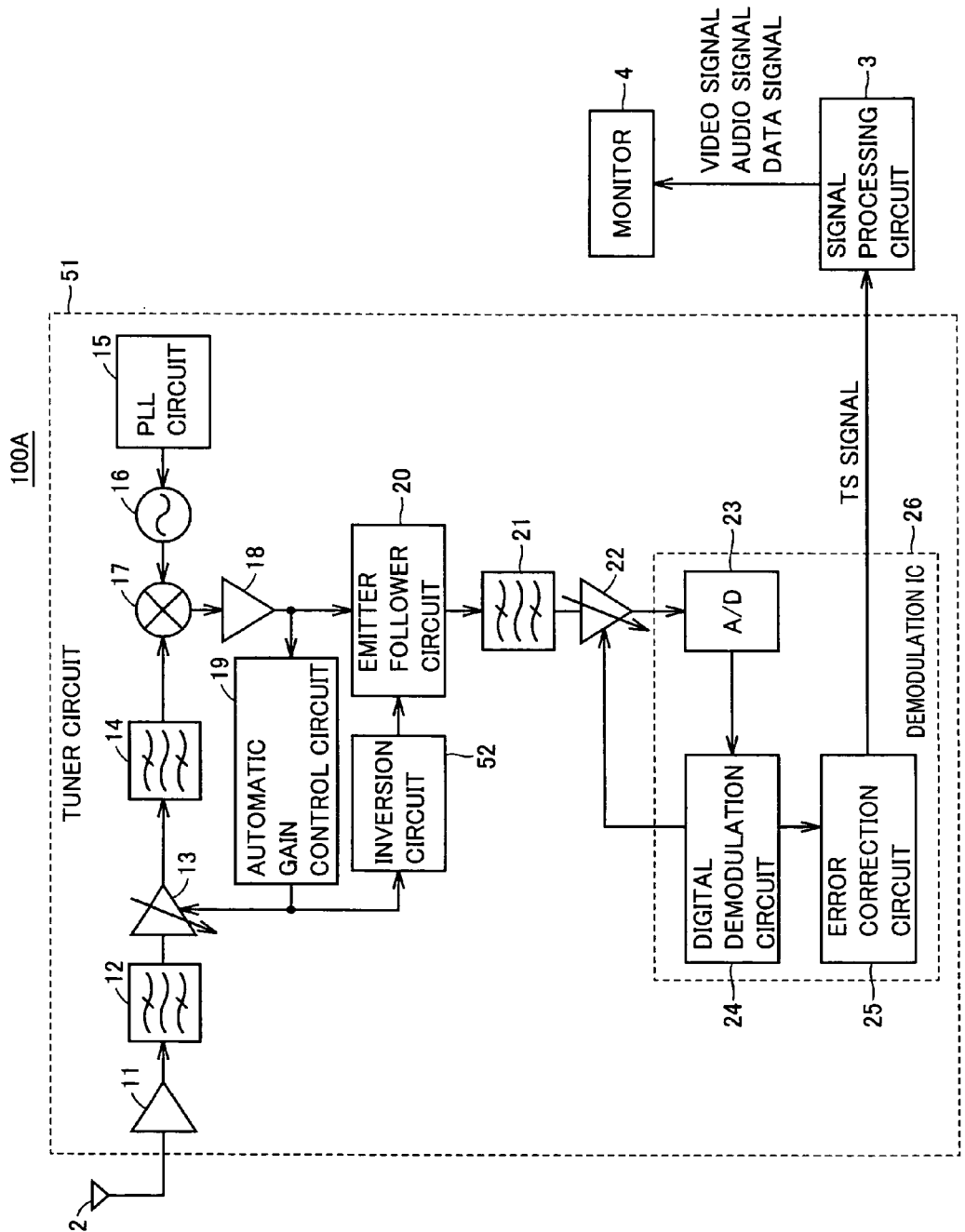
FIG. 4 is a block diagram illustrating a schematic configuration of a digital broadcast receiver according to a second embodiment of the present invention.

FIG. 4 is a block diagram illustrating a schematic configuration of a digital broadcast receiver 100A according to a second embodiment of the present invention, and correlates with FIG. 1. Digital broadcast receiver 100A includes a tuner circuit 51 and a signal processing circuit 3. Tuner circuit 51 illustrated in FIG. 4 is different from tuner circuit 1 illustrated in FIG. 1 in the following point: an inversion circuit 52 is newly provided. It is to be noted that parts in FIG. 4 corresponding to those in FIG. 1 are denoted by the identical symbols in FIG. 1; therefore, detailed description thereof will not be given here.

With reference to FIG. 4, inversion circuit 52 inverts an RF-AGC voltage output from an automatic gain control circuit 19, and supplies a resultant voltage to an emitter follower circuit 20. This circuit configuration is applied to a case of using automatic gain control circuit 19 of a reverse type that reduces an RF-AGC voltage as a reception signal is at a high level. In general, automatic gain control circuit 19 of such a reverse type is frequently used.

Figure 5:
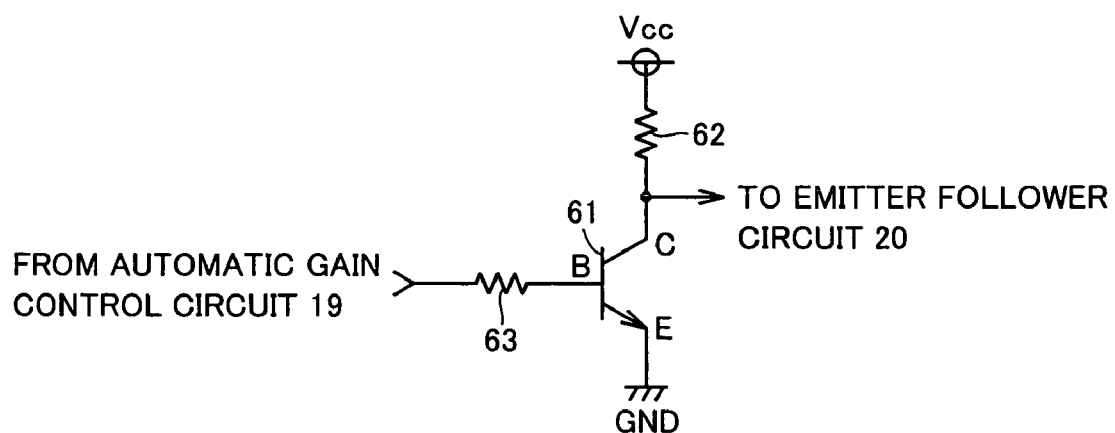
FIG. 5 is a circuit diagram illustrating a configuration of an inversion circuit illustrated in FIG. 4.

FIG. 5 is a circuit diagram illustrating a configuration of inversion circuit 52 illustrated in FIG. 4. As illustrated in FIG. 5, inversion circuit 52 includes a transistor 61 (e.g., bipolar transistor), and resistor elements 62 and 63. Resistor element 62 and transistor 61 are connected in series between a line of a power supply potential Vcc and a line of a ground potential GND. Transistor 61 has a collector C connected to emitter follower circuit 20 illustrated in FIG. 4. Resistor element 63 is connected between an output node of automatic gain control circuit 19 illustrated in FIG. 4 and a base B of transistor 61. That is, the RF-AGC voltage output from automatic gain control circuit 19 is supplied to base B of transistor 61 through resistor element 63. Consequently, when the RF-AGC voltage becomes high, a base voltage of transistor 61 is boosted. Therefore, an on-resistance of transistor 61 is decreased and a voltage to be supplied from collector C to emitter follower circuit 20 is reduced. On the other hand, when the RF-AGC voltage becomes low, the base voltage of transistor 61 is reduced. Therefore, the on-resistance of transistor 61 is increased and the voltage to be supplied from collector C to emitter follower circuit 20 is boosted.

Specifically, when an interference signal is at a high level, a level of a reception signal becomes high; therefore, an RF-AGC voltage is reduced. Accordingly, a voltage to be supplied from automatic gain control circuit 19 to emitter follower circuit 20 is boosted and a drive current of a transistor for current amplification included in emitter follower circuit 20 becomes large; therefore, distortion performance of emitter follower circuit 20 is improved. As a result, emitter follower circuit 20 has a small distortion level and, therefore, can avoid an influence of spurious interference.

On the other hand, in a normal state where an interference signal is at a low level, a level of a reception signal fails to become high; therefore, an RF-AGC voltage is kept at a high level. Accordingly, the voltage to be supplied from automatic gain control circuit 19 to emitter follower circuit 20 is kept at a low level and the drive current of the transistor for current amplification included in emitter follower circuit 20 fails to become large; therefore, low power consumption is achieved. As in the first embodiment, it is possible to realize a tuner circuit and a digital broadcast receiver with good distortion performance and low power consumption in the second embodiment.

Herein, the configuration of inversion circuit 52 is not limited to that illustrated in FIG. 5. Inversion circuit 52 may have any configurations as long as it outputs a voltage at a low level if an input voltage is at a high level and outputs a voltage at a high level if an input voltage is at a low level. For example, inversion circuit 52 may include a P-channel transistor and an N-channel transistor connected in series and invert a logic level of a signal.

Third Embodiment

Figure 6:
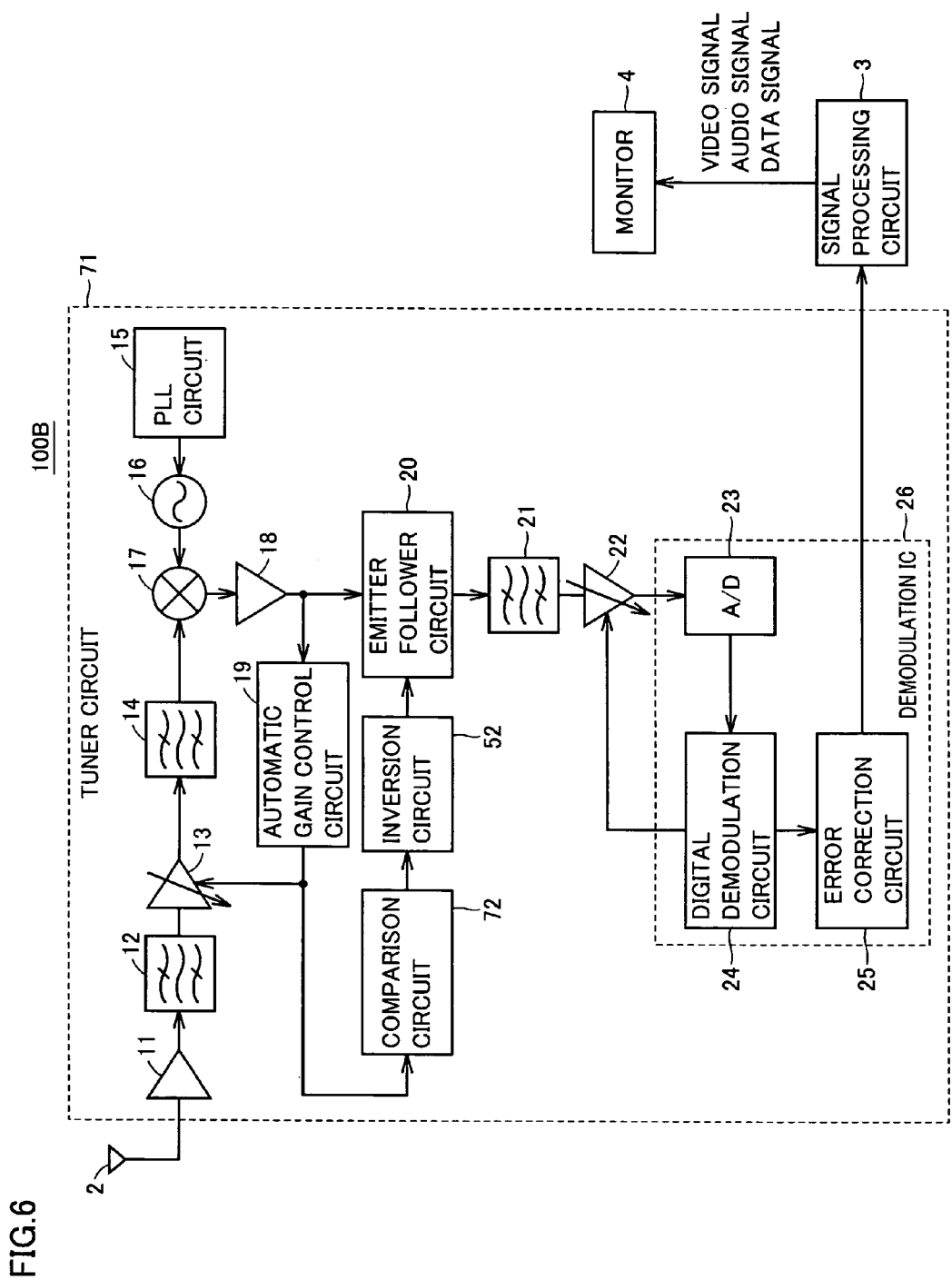
FIG. 6 is a block diagram illustrating a schematic configuration of a digital broadcast receiver according to a third embodiment of the present invention.

FIG. 6 is a block diagram illustrating a schematic configuration of a digital broadcast receiver 100B according to a third embodiment of the present invention, and correlates with FIG. 4. Digital broadcast receiver 100B includes a tuner circuit 71 and a signal processing circuit 3. Tuner circuit 71 illustrated in FIG. 6 is different from tuner circuit 51 illustrated in FIG. 4 in the following point: a comparison circuit 72 is newly provided. It is to be noted that parts in FIG. 6 corresponding to those in FIG. 4 are denoted by the identical symbols in FIG. 4; therefore, detailed description thereof will not be given here.

With reference to FIG. 6, comparison circuit 72 compares an RF-AGC voltage output from an automatic gain control circuit 19 with a reference voltage, and outputs a voltage to an inversion circuit 52 in accordance with a result of the comparison.

Figure 7:
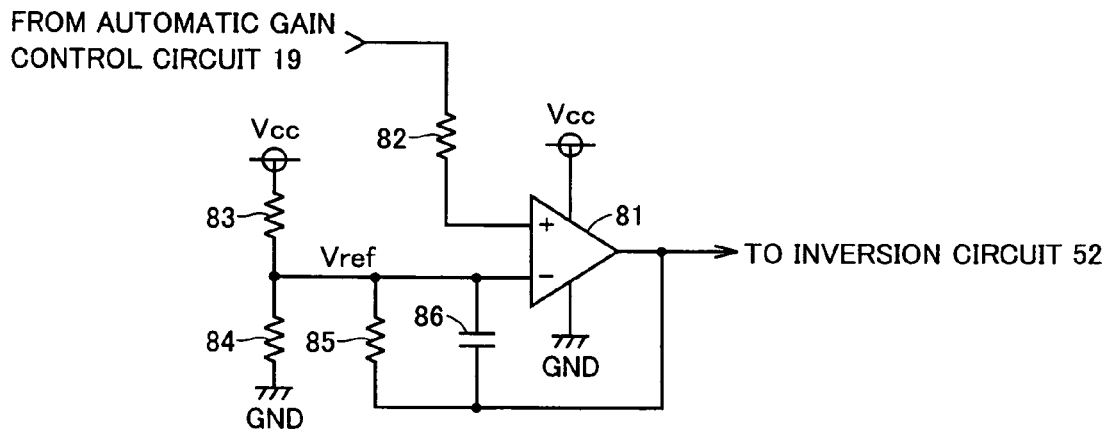
FIG. 7 is a circuit diagram illustrating a configuration of a comparison circuit illustrated in FIG. 6.

FIG. 7 is a circuit diagram illustrating a configuration of comparison circuit 72 illustrated in FIG. 6. As illustrated in FIG. 7, comparison circuit 72 includes an operational amplifier 81, resistor elements 82, 83, 84 and 85, and a capacitor 86. Resistor element 82 is connected between an output node of automatic gain control circuit 19 illustrated in FIG. 6 and a non inverting input terminal (+) of operational amplifier 81. Resistor elements 83 and 84 are connected in series between a line of a power supply potential Vcc and a line of a ground potential GND. A node between resistor elements 83 and 84 is connected to an inverting input terminal (−) of operational amplifier 81. Resistor element 85 and capacitor 86 are connected in parallel between an output terminal and the inverting input terminal (−) in operational amplifier 81. The output terminal of operational amplifier 81 is connected to inversion circuit 52 illustrated in FIG. 6.

This circuit configuration is applied to a case of using automatic gain control circuit 19 of a reverse type that reduces an RF-AGC voltage as a reception signal is at a high level. In general, automatic gain control circuit 19 of such a reverse type is frequently used.

The RF-AGC voltage output from automatic gain control circuit 19 is supplied to the non inverting input terminal (+) of operational amplifier 81 through resistor element 82. A voltage Vcc generated between the line of power supply potential Vcc and the line of ground potential GND is divided by resistor elements 83 and 84 and, then, is supplied to the inverting input terminal (−) of operational amplifier 81 as a reference voltage Vref Operational amplifier 81 compares the RF-AGC voltage supplied to the non inverting input terminal (+) with reference voltage Vref supplied to the inverting input terminal (−), and supplies a voltage to an emitter follower circuit 20 in accordance with a result of the comparison.

Figure 8:
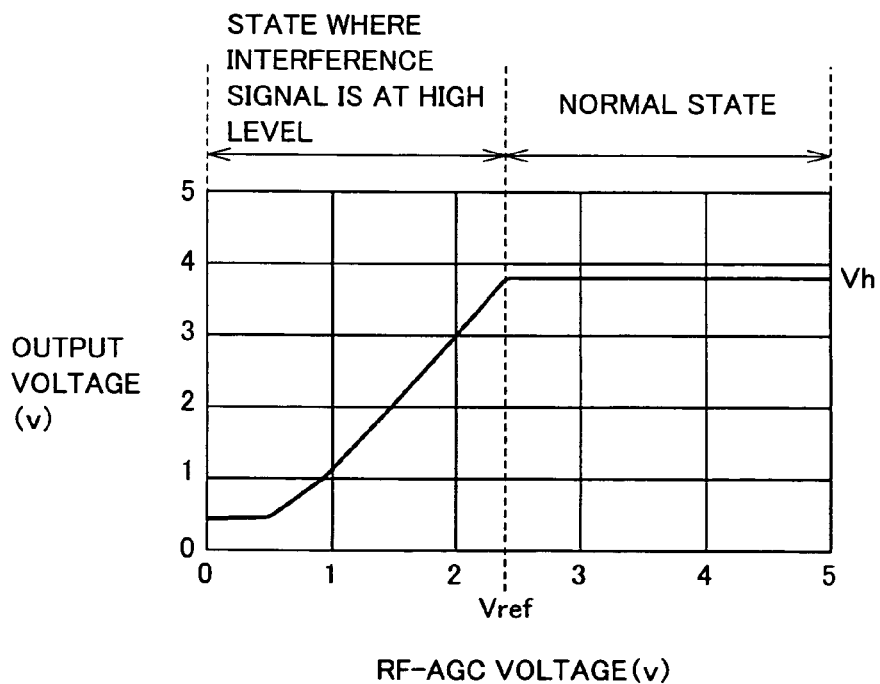
FIG. 8 is a timing chart showing an operation of the comparison circuit illustrated in FIG. 7.
Figure 9:
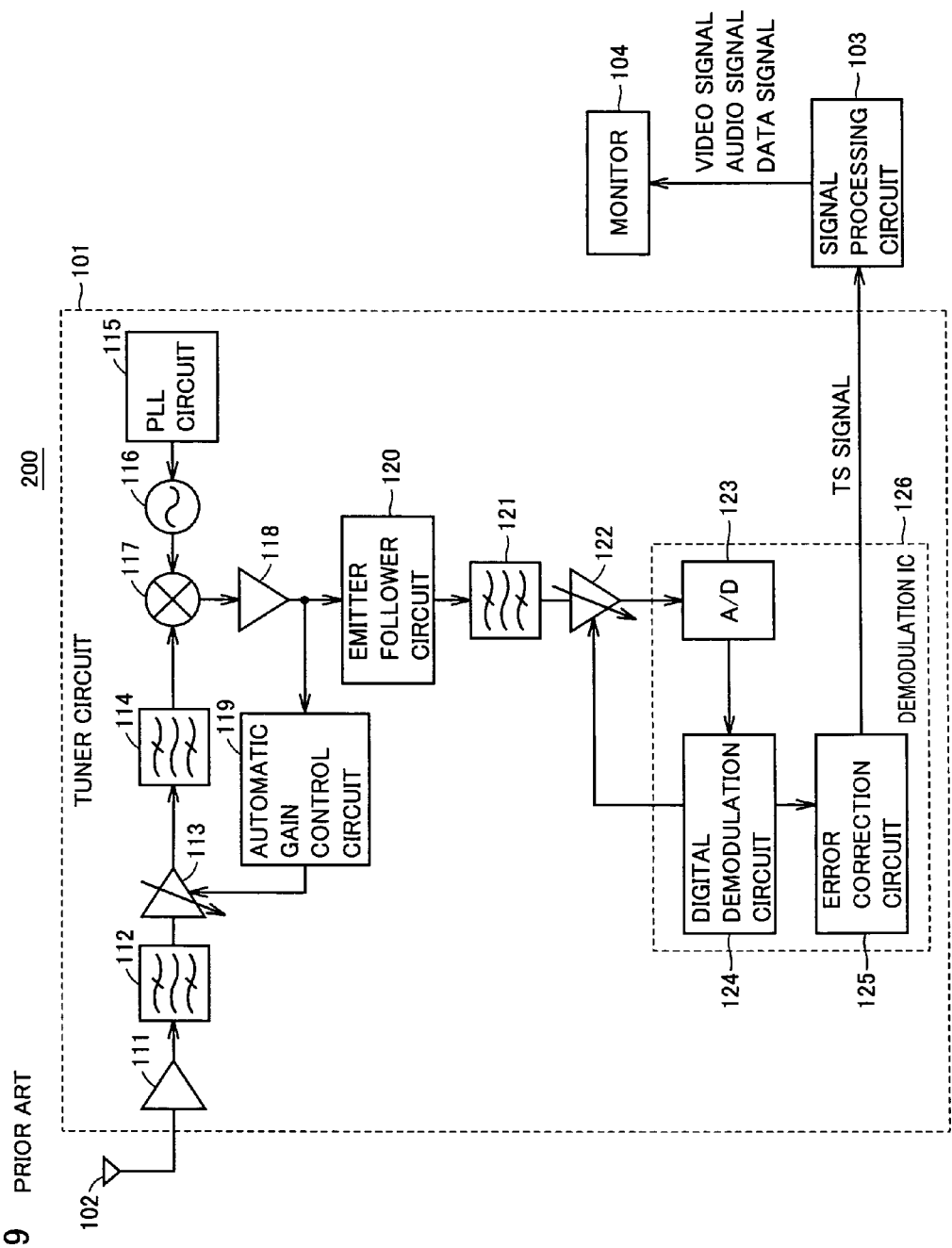
FIG. 9 is a block diagram illustrating a schematic configuration of a conventional digital broadcast receiver.
Figure 10:
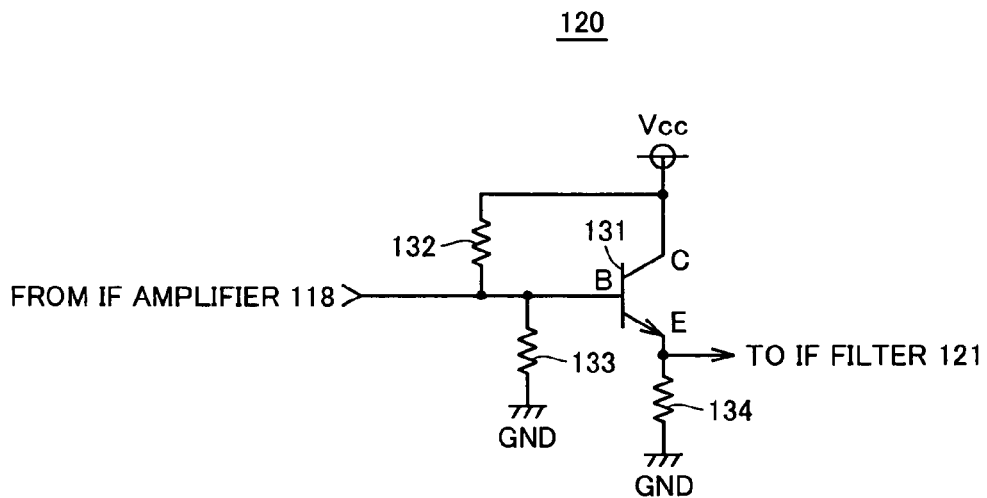
FIG. 10 is a circuit diagram illustrating a configuration of an emitter follower circuit illustrated in FIG. 9.
Figure 11:
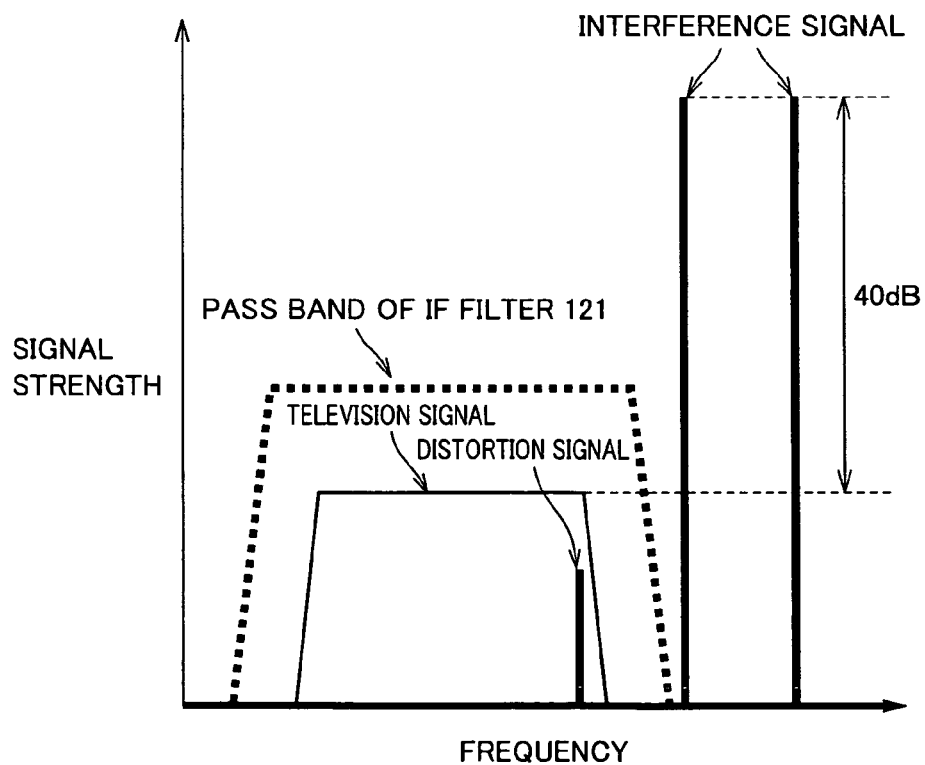
FIG. 11 shows distortion performance of the emitter follower circuit.

FIG. 8 is a timing chart showing an operation of comparison circuit 72 illustrated in FIG. 7. FIG. 8 shows, as one example, a case where power supply potential Vcc is 5.0 V and reference voltage Vref is 2.3 V.

With reference to FIG. 8, if the RF-AGC voltage is higher than reference voltage Vref, a voltage output from comparison circuit 72 is set at a certain value Vh (e.g., 3.8 V). If the RF-AGC voltage is lower than reference voltage Vref, a voltage output from comparison circuit 72 is made almost proportional to the RF-AGC voltage.

In a case of using automatic gain control circuit 19 of the reverse type, when an interference signal is at a high level, a level of a reception signal becomes high. Therefore, the RF-AGC voltage becomes lower than reference voltage Vref (e.g., 2.3 V). In response to this, the voltage output from comparison circuit 72 is reduced. In other words, a voltage output from inversion circuit 52 provided at a poststage of comparison circuit 72 is boosted. Accordingly, a voltage to be supplied from inversion circuit 52 to emitter follower circuit 20 is boosted and a drive current of a transistor for current amplification included in emitter follower circuit 20 becomes large; thus, distortion performance of emitter follower circuit 20 is improved. As a result, emitter follower circuit 20 has a small distortion level and, therefore, can avoid an influence of spurious interference.

On the other hand, in a normal state where an interference signal is at a low level, a level of a reception signal fails to become high; therefore, a RF-AGC voltage is kept at a level higher than reference voltage Vref (e.g., 2.3 V). Consequently, the voltage output from comparison circuit 72 is set at certain value Vh (e.g., 3.8 V). In other words, the voltage output from inversion circuit 52 provided at a poststage of comparison circuit 72 is kept at a low level. Accordingly, the voltage to be supplied from inversion circuit 52 to emitter follower circuit 20 is kept at a low level and the drive current of the transistor for current amplification included in emitter follower circuit 20 fails to become large; thus, low power consumption is achieved.

Herein, the value of reference voltage Vref can be optionally set based on a resistance ratio of each of resistor elements 83 and 84 and power supply potential Vcc. More specifically, only when the RF-AGC voltage output from automatic gain control circuit 19 is lower than optionally set reference voltage Vref, the distortion performance of emitter follower circuit 20 can be improved.

Accordingly, as in the first and second embodiments, it is possible to realize a tuner circuit and a digital broadcast receiver with good distortion performance and low power consumption in the third embodiment. Further, addition of comparison circuit 72 makes it possible to widen the degree of freedom in design. As a result, it is possible to suitably control the drive current of the transistor for current amplification included in emitter follower circuit 20.

In the third embodiment, the description is given of the case of using automatic gain control circuit 19 of the reverse type. Alternatively, in a case of using automatic gain control circuit 19 of a forward type, inversion circuit 52 is removed and the non inverting input terminal (+) and the inverting input terminal (−) in operational amplifier 81 are switched to each other.

In the first to third embodiments, the description is given of the case where the drive current of the transistor for current amplification included in emitter follower circuit 20 is made large in accordance with the RF-AGC voltage output from automatic gain control circuit 19, so that the distortion performance of emitter follower circuit 20 is improved. Moreover, distortion performance of a mixing circuit 17 may be improved in such a manner that a drive current of a transistor for frequency conversion included in mixing circuit 17 is made large. Further, distortion performance of a wide band amplifier 11 may be improved in such a manner that a drive current of a transistor for amplification included in wide band amplifier 11 is made large. The reason therefore is as follows: the distortion performance of emitter follower circuit 20 is most problematic in a case where an interference signal is at a high level, and the distortion performance of each of mixing circuit 17 and wide band amplifier 11 is also problematic subsequently to the distortion performance of emitter follower circuit 20.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A tuner circuit receiving a television signal of a digital broadcast, comprising:
    a radio frequency amplifier having a variable gain, radio frequency amplifying said received television signal, and outputting a resultant signal;
    an oscillator generating a local oscillation signal at an oscillation frequency corresponding to a frequency of a desired channel;
    a mixing circuit mixing the signal output from said radio frequency amplifier with said local oscillation signal, frequency converting a resultant signal to a signal at an intermediate frequency, and outputting a resultant signal;
    an emitter follower circuit including a transistor for current amplification, having a high input impedance and a low output impedance, and current amplifying the signal output from said mixing circuit;
    a gain control circuit outputting a control voltage for automatically controlling the gain of said radio frequency amplifier such that the signal output from said radio frequency amplifier is kept at a certain level, in accordance with a level of the signal output from said mixing circuit; and
    a demodulation circuit receiving the signal output from said mixing circuit through said emitter follower circuit, digital demodulating the received signal, and generating a transport stream signal, wherein
    said emitter follower circuit varies a drive current of said transistor for current amplification such that a distortion level becomes small, in accordance with the control voltage output from said gain control circuit, and wherein said emitter follower circuit receives a first signal and a second signal, the first signal is the resultant signal outputted from said mixing circuit, and the second signal is the control voltage outputted from said gain control circuit.

2. The tuner circuit according to claim 1, wherein said emitter follower circuit varies a bias voltage of said transistor for current amplification to thereby vary the drive current of said transistor for current amplification, in accordance with the control voltage output from said gain control circuit.

3. The tuner circuit according to claim 1, wherein said emitter follower circuit varies a bias current of said transistor for current amplification to thereby vary the drive current of said transistor for current amplification, in accordance with the control voltage output from said gain control circuit.

4. The tuner circuit according to claim 1, further comprising:
an inversion circuit provided between said gain control circuit and said emitter follower circuit, said inversion circuit inverting the control voltage output from said gain control circuit, and outputting a resultant voltage.

5. The tuner circuit according to claim 1, further comprising:
a comparison circuit provided between said gain control circuit and said emitter follower circuit, said comparison circuit comparing the control voltage output from said gain control circuit with a predetermined reference voltage, and outputting a voltage in accordance with a result of the comparison.

6. The tuner circuit according to claim 1, wherein said mixing circuit includes a transistor for frequency conversion, and varies a drive current of said transistor for frequency conversion such that a distortion level becomes small, in accordance with the control voltage output from said gain control circuit.

7. The tuner circuit according to claim 1, further comprising:
a wide band amplifier provided at a prestage of said radio frequency amplifier, said wide band amplifier including a transistor for amplification, amplifying a received television signal over a wide frequency band, and outputting a resultant signal, wherein
said wide band amplifier varies a drive current of said transistor for amplification such that a distortion level becomes small, in accordance with the control voltage output from said gain control circuit.

8. The tuner circuit according to claim 1, wherein said emitter follower circuit has a first input receiving the resultant signal outputted from said mixing circuit and a second input receiving the control voltage outputted from said gain control circuit.

9. A digital broadcast receiver comprising:
a tuner circuit receiving a television signal of a digital broadcast; and
a signal processing circuit converting a signal output from said tuner circuit to an audio-visual signal, wherein
said tuner circuit includes:
a radio frequency amplifier having a variable gain, radio frequency amplifying said received television signal, and outputting a resultant signal;
an oscillator generating a local oscillation signal at an oscillation frequency corresponding to a frequency of a desired channel;
a mixing circuit mixing the signal output from said radio frequency amplifier with said local oscillation signal, frequency converting a resultant signal to a signal at an intermediate frequency, and outputting a resultant signal;
an emitter follower circuit including a transistor for current amplification, having a high input impedance and a low output impedance, and current amplifying the signal output from said mixing circuit;
a gain control circuit outputting a control voltage for automatically controlling the gain of said radio frequency amplifier such that the signal output from said radio frequency amplifier is kept at a certain level, in accordance with a level of the signal output from said mixing circuit; and
a demodulation circuit receiving the signal output from said mixing circuit through said emitter follower circuit, digital demodulating the received signal, and generating a transport stream signal, and
said emitter follower circuit varies a drive current of said transistor for current amplification such that a distortion level becomes small, in accordance with the control voltage output from said gain control circuit,
wherein said emitter follower circuit receives a first signal and a second signal, the first signal is the resultant signal outputted from said mixing circuit, and the second signal is the control voltage outputted from said gain control circuit.

10. The digital broadcast receiver according to claim 9, wherein
said emitter follower circuit varies a bias voltage of said transistor for current amplification to thereby vary the drive current of said transistor for current amplification, in accordance with the control voltage output from said gain control circuit.

11. The digital broadcast receiver according to claim 9, wherein
said emitter follower circuit varies a bias current of said transistor for current amplification to thereby vary the drive current of said transistor for current amplification, in accordance with the control voltage output from said gain control circuit.

12. The digital broadcast receiver according to claim 9, wherein
said tuner circuit further includes an inversion circuit provided between said gain control circuit and said emitter follower circuit, said inversion circuit inverting the control voltage output from said gain control circuit, and outputting a resultant voltage.

13. The digital broadcast receiver according to claim 9, wherein
said tuner circuit further includes a comparison circuit provided between said gain control circuit and said emitter follower circuit, said comparison circuit comparing the control voltage output from said gain control circuit with a predetermined reference voltage, and outputting a voltage in accordance with a result of the comparison.

14. The digital broadcast receiver according to claim 9, wherein
said mixing circuit includes a transistor for frequency conversion, and varies a drive current of said transistor for frequency conversion such that a distortion level becomes small, in accordance with the control voltage output from said gain control circuit.

15. The digital broadcast receiver according to claim 9, wherein said tuner circuit further includes a wide band amplifier provided at a prestage of said radio frequency amplifier, said wide band amplifier including a transistor for amplification, amplifying a received television signal over a wide frequency band, and outputting a resultant signal, and said wide band amplifier varies a drive current of said transistor for amplification such that a distortion level becomes small, in accordance with the control voltage output from said gain control circuit.

16. The digital broadcast receiver according to claim 9, wherein said emitter follower circuit has a first input receiving the resultant signal outputted from said mixing circuit and a second input receiving the control voltage outputted from said gain control circuit.

* * * * *